(12) United States Patent
Lemkin et al.

(10) Patent No.: US 7,375,594 B1
(45) Date of Patent: May 20, 2008

(54) RADIO OSCILLATOR TUNING

(75) Inventors: Mark Lemkin, Albany, CA (US); Ben Cook, Berkeley, CA (US)

(73) Assignee: Dust Networks, Inc., Hayward, CA (US)

( * ) Notice: Subject to any disclaimer, the term of this patent is extended or adjusted under 35 U.S.C. 154(b) by 127 days.

(21) Appl. No.: 11/484,433

(22) Filed: Jul. 11, 2006

Related U.S. Application Data

(60) Provisional application No. 60/698,758, filed on Jul. 12, 2005.

(51) Int. Cl.
*G01R 23/00* (2006.01)
*H03B 5/12* (2006.01)
*H03L 7/099* (2006.01)

(52) U.S. Cl. .......................... 331/44; 331/16; 331/179

(58) Field of Classification Search ................ 331/14, 331/16, 18, 25, 36 C, 44, 117 R, 117 FE, 331/117 D, 177 R, 179, DIG. 2
See application file for complete search history.

(56) References Cited

U.S. PATENT DOCUMENTS

| 5,748,103 A | 5/1998 | Flach et al. |
| 6,388,532 B1 * | 5/2002 | Babcock ..................... 331/44 |

FOREIGN PATENT DOCUMENTS

GB   2271691 A   9/1992

* cited by examiner

*Primary Examiner*—David Mis
(74) *Attorney, Agent, or Firm*—Van Pelt, Yi & James LLP

(57) ABSTRACT

Tuning a radio oscillator frequency to a reference frequency is disclosed. A radio oscillator is set using a predetermined value loaded into an adjustment bit array. A highest selected bit is selected to be used in locating a final tuned value for the adjustment bit array. The final tuned value is determined by successively setting a selected bit starting with the highest selected bit in the adjustment bit array. And, the selected bit value in the final tuned value is determined using a measurement of the radio oscillator frequency and its relation to a reference frequency.

26 Claims, 9 Drawing Sheets

RADIO OSCILLATOR TUNING

CROSS REFERENCE TO OTHER APPLICATIONS

This application claims priority to U.S. Provisional Patent Application No. 60/698,758 entitled DIGITALLY CONTROLLED OSCILLATOR filed Jul. 12, 2005 which is incorporated herein by reference for all purposes.

BACKGROUND OF THE INVENTION

Digital electronic devices—for example, radios—use high frequency clocks to drive their electronic processing. In some cases, the high frequency is used to translate an incoming radio signal to a lower frequency signal or to demodulate an information carrying signal from a modulated higher frequency carrier. For stability, the high frequency clock is often locked to a reference clock at a lower frequency (e.g., a crystal oscillator). One common solution for synchronizing the divided high frequency clock and the crystal clock is to use a phase locked loop or frequency locked loop, either of which are persistently adjusting the high frequency clock to keep it synchronized to the crystal clock. However, the loops settle at a bandwidth that is about $1/10$ the crystal clock frequency, which requires a long time to settle if a low frequency crystal oscillator is used, such as a 32.768 KHz watch crystal oscillator (and thus wastes power). It would be beneficial to have synchronization between the clocks without a long settling time so that power is conserved. Furthermore, it would be beneficial to have a synchronization method that may be disabled once the target frequency was reached to save power.

BRIEF DESCRIPTION OF THE DRAWINGS

Various embodiments of the invention are disclosed in the following detailed description and the accompanying drawings.

DETAILED DESCRIPTION

Figure 1:
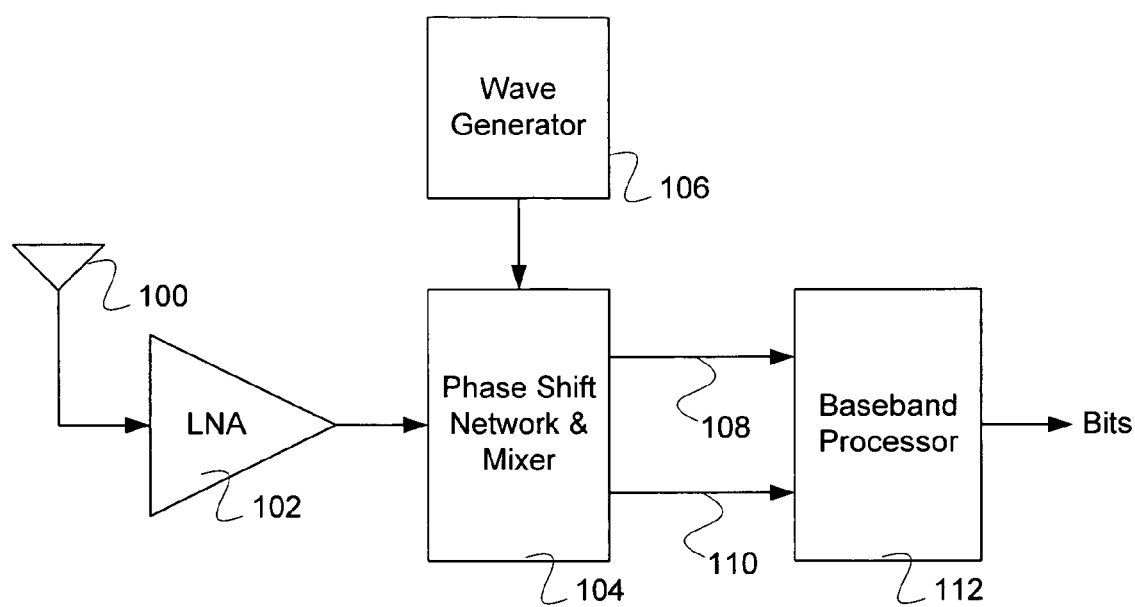
FIG. 1 is a block diagram illustrating an embodiment of a receiver system in which an oscillator frequency is tuned to a reference frequency.

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Tuning a radio oscillator frequency to a reference frequency is disclosed. A radio oscillator is set using a predetermined value loaded into an adjustment bit array. A highest selected bit to be used in locating a final tuned value for the adjustment bit array is selected. The final tuned value is determined by successively setting a selected bit starting with the highest selected bit in the adjustment bit array. The selected bit value in the final tuned value is determined using a measurement of the radio oscillator frequency and its relation to a reference frequency. For example, the oscillator is tuned to the all "ones" frequency known to be above the reference frequency; the highest bit is toggled to "zero;" the frequency of the oscillator is measured to see if it is below the reference frequency; if the frequency is below, then the bit is toggled back to "one," otherwise it is left at "zero;" this process is repeated for the remaining bits from highest to lowest significance. This process will rapidly tune the oscillator to become closer to the reference frequency by approaching the frequency in steps from one side (e.g., the high side), because bit toggles that make steps that overshoot the reference frequency are not accepted.

In some embodiments, once the oscillator is tuned (i.e., the capacitor values have been set), one or all of the elements of the tuning circuit (e.g., frequency locking engine, divider, etc.) is turned off to substantially save on power consumption. In some embodiments, after tuning to a particular frequency, the final values of the capacitor array are stored in a digital memory so that the next time tuning to that particular frequency is needed one just has to look up the proper array values and load them into the capacitor array.

In some embodiments, a successive approximation algorithm is used to set a final tuned value loaded in an adjustment bit array that sets an oscillator frequency. The oscillator frequency is set at a maximum value (e.g., all "1"). A highest bit to tune is selected and set from a "1" to a "0." A measurement is made of the oscillator frequency and its relation to a reference frequency. The measurement is used to determine what to set the selected bit to—for example, if the measurement indicates that the oscillator frequency is still higher than the reference frequency, then the bit is left set to "0." If the measurement indicates that the oscillator frequency is lower than the reference frequency, then the bit is reset to "1." The next highest bit is selected to tune and set from a "1" to a "0." A measurement is made and the bit is determined as above. Each successive bit is determined. Rapid convergence to a final tuned value is achieved. In various embodiments, successive approximation is approached from a minimum value instead of from a maximum value, successive approximation is approached from a predetermined coarse value and successive approximation is used to set a fine value, successive approximation is approached from a predetermined coarse minimum or maximum value and successive approximation is used to set a fine value, or any other appropriate way to use successive approximation to determine a final tuned value.

In some embodiments, coarse and fine bits are used to set and/or adjust the oscillator frequency. In some embodiments, a set of bits is one or more of the following: binary weighted, weighted such that when incrementing the array in a positive direction the change in the capacitance is non-monotonic, weighted such that when incrementing the array in a negative direction the change in the capacitance is non-monotonic, linearly weighted, non-linearly weighted, monotonically weighted, or any other appropriate weighting of bits.

In some embodiments a set of bits is sub-binary weighted, i.e. $w^n$ where w is less than 2 and n counts starting from 0 by steps of 1 (for example, if w=1.5: 1, 1.5, 2.25, 3.375, 5.0625, 7.5938, 11.3906). In some embodiments, the coarse bits are binary weighted to cover a wide range of values, the fine bits are weighted so that despite process variation all frequencies are accessible such as sub-binary as described above.

In some embodiments, the oscillator frequency is divided down and compared with the reference frequency (e.g., the divided down frequency is less than the reference, the divided down frequency is greater than the reference, etc.). In some embodiments, a counter counts the number of oscillator cycles that occur over a number of reference clock cycles; the number of reference clock cycles may be 1 or greater than 1.

In some embodiments, the capacitor array is made of mimcaps (metal-insulator-metal capacitors). Mimcaps can provide superior power supply rejection because of the low voltage coefficient of mimcaps (i.e., less variation of capacitance value as a function of supply voltage). In some embodiments, the capacitor tuning elements are varactors.

FIG. 1 is a block diagram illustrating an embodiment of a receiver system in which an oscillator frequency is tuned to a reference frequency. In the example shown, antenna 100 is connected to the input of low noise amplifier (LNA) 102. LNA 102 is designed to amplify signals picked up by the antenna. The output of LNA 102 is connected to phase shift network & mixer 104. Phase shift network & mixer 104 is designed to mix the signal from LNA 102 with two reference signals, where the two reference signals are a reference signal at a particular frequency that are phase shifted approximately 90° apart. The reference signal is input to phase shift network & mixer 104 from wave generator 106. Wave generation 106 is designed to output a particular frequency wave, where the frequency of the wave is such that a divided down version of the frequency has been tuned to a reference crystal (e.g., a watch crystal). Phase shift network & mixer 104 outputs two mixed signals (108 and 110) to baseband processor 112. Baseband processor 112 is designed to process input mixed signals and output encoded information in the form of bits. In some embodiments, phase shift network & mixer 104 and baseband processor 112 demodulate frequency or phase shift key modulated information, or data bits, on a carrier frequency.

Figure 2:
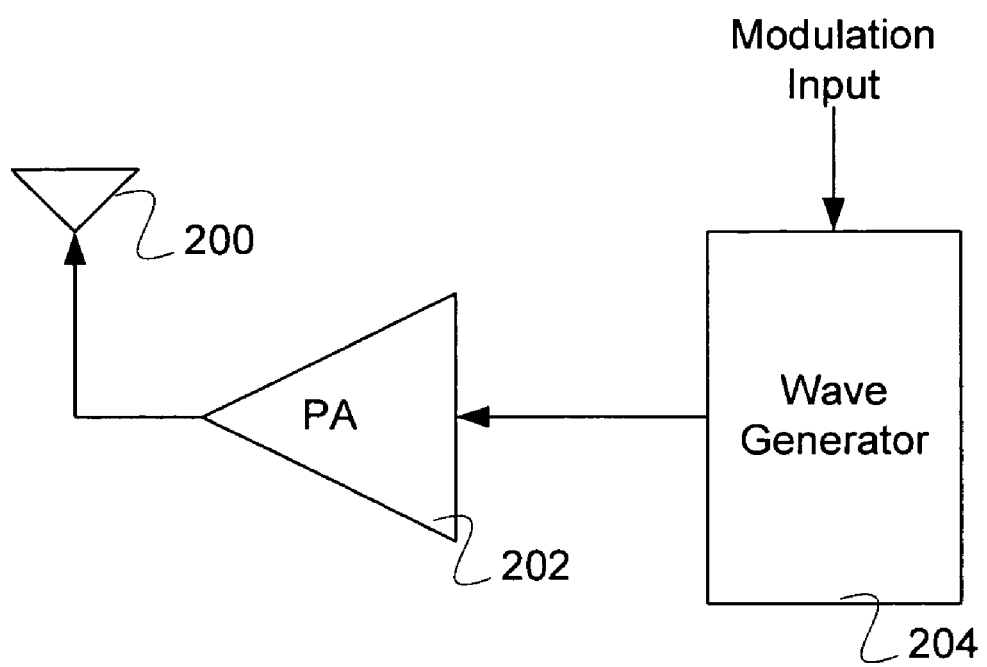
FIG. 2 is a block diagram illustrating an embodiment of a transmitter system in which an oscillator frequency is tuned to a reference frequency.

FIG. 2 is a block diagram illustrating an embodiment of a transmitter system in which an oscillator frequency is tuned to a reference frequency. In the example shown, wave generator 204 is input information to modulate the waveform. Wave generation 204 is designed to output a particular frequency wave, where the frequency of the wave is such that a divided down version of the frequency has been tuned to a reference crystal (e.g., a watch crystal), and where the frequency wave is modulated. In various embodiments, the wave is modulated using frequency modulation, phase modulation, amplitude modulation, or any other appropriate modulation. Wave generator 204 output is input to power amplifier (PA) 202. Power amplifier 202 is designed to amplify the signal for transmission. PA 202 output is connected to antenna 200.

Figure 3:
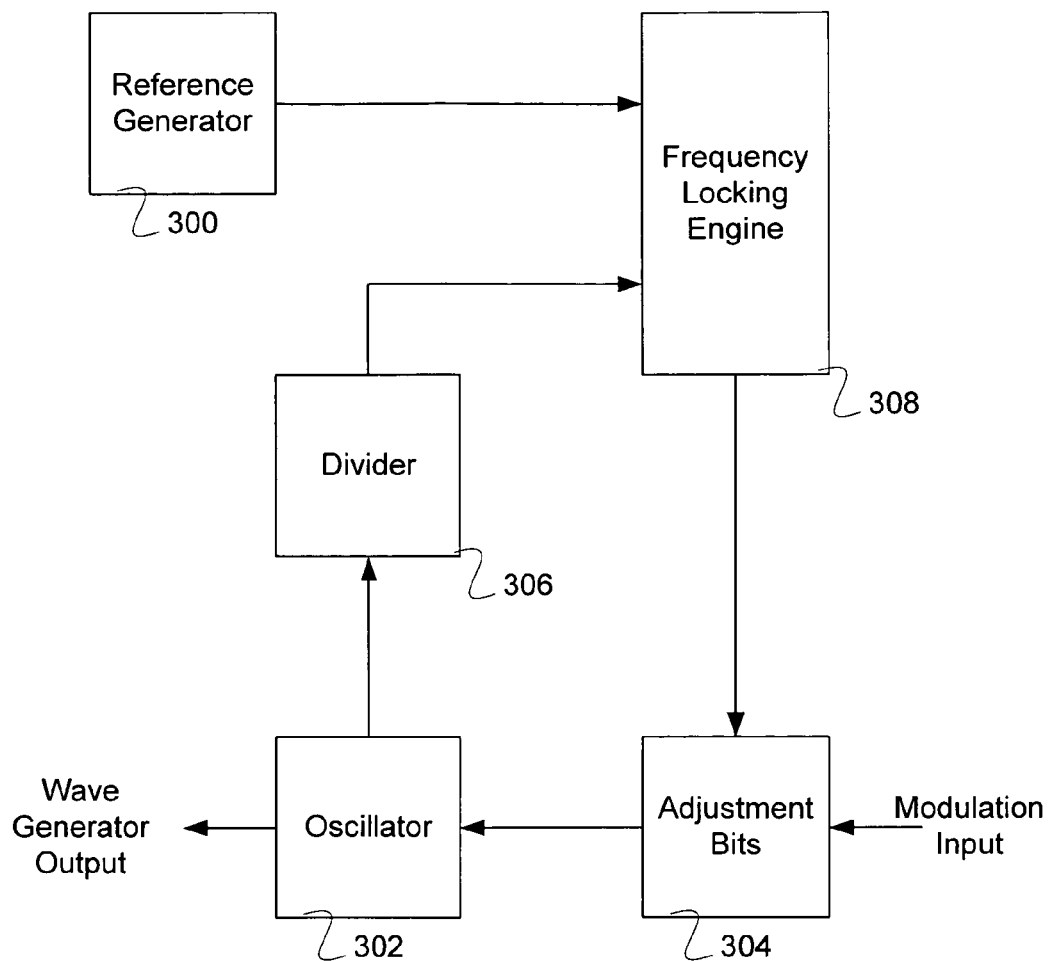
FIG. 3 is a block diagram illustrating an embodiment of a wave generator in which an oscillator frequency is tuned to a reference frequency.

FIG. 3 is a block diagram illustrating an embodiment of a wave generator in which an oscillator frequency is tuned to a reference frequency. In some embodiments, the wave generator of FIG. 3 is used to implement 106 of FIG. 1 and/or 204 of FIG. 2. In the example shown, reference generator 300 is connected to frequency locking engine 308. In various embodiments, reference generator 300 is a crystal oscillator, a watch crystal oscillator, a quartz crystal oscillator, an oscillator, a 32.768 KHz oscillator, or any other appropriate reference generator. Frequency locking engine 308 is connected to adjustment bits 304. Frequency locking engine 308 sets adjustment bits 304 to set the frequency of oscillator 302. Adjustment bits 304 are multiple bits that are used to set the frequency of oscillator 302. The adjustment bits of adjustment bits 304 add or subtract a capacitance in an oscillator circuit to change the frequency of the oscillator. In various embodiments, the capacitor values are chosen such that the adjustment bits linearly, non-linearly, monotonically, or non-monotonically adjust the oscillation frequency. The adjustment bits of adjustment bits 304 can also directly modulate the frequency of oscillator 302 for putting information on the wave output by the wave generator. A separate capacitor sub-array may be used for this purpose. Oscillator 302 also outputs a clock that is input to optional divider 306. Divider 306 is designed to divide the oscillator output frequency and output this divided down frequency to frequency locking engine 308. Frequency locking engine 308 is designed to compare the divided down frequency from oscillator 302 with the frequency from reference generator 300 and adjust oscillator 302 using adjustment bits 304 such that the divided frequency is close to the reference frequency provided by reference generator 300.

Figure 4A:
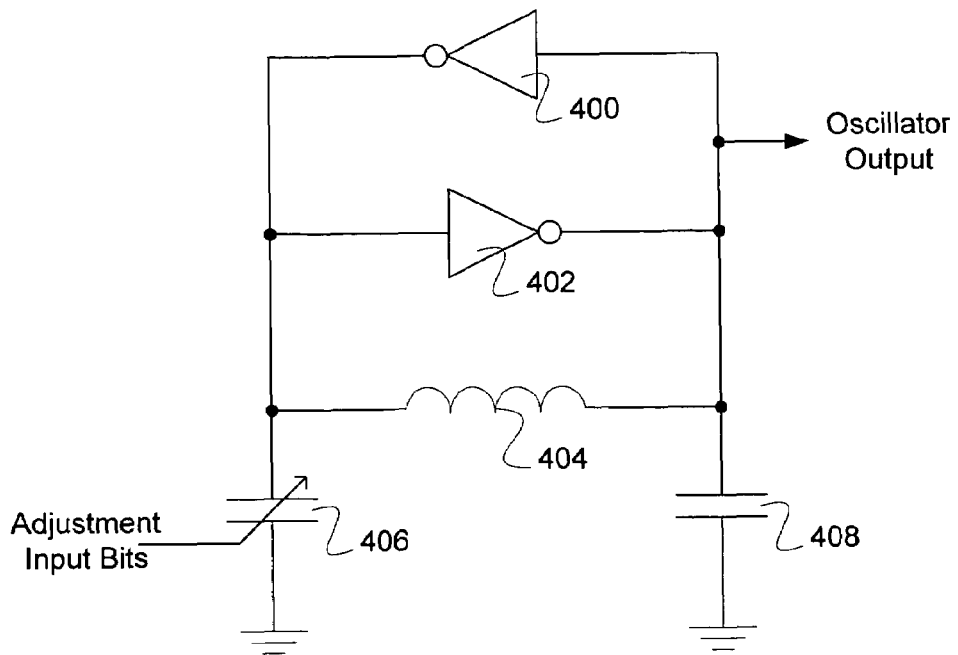
FIG. 4A is a circuit diagram illustrating an embodiment of an oscillator circuit.

FIG. 4A is a circuit diagram illustrating an embodiment of an oscillator circuit. In some embodiments, the oscillator of FIG. 4A is used to implement oscillator 302 of FIG. 3. In the example shown, the oscillator circuit includes inverters 400 and 402, inductor 404, and capacitors 406 and 408. Inverter 400 output, inverter 402 input, inductor 404 and capacitor 406 are connected together. Inverter 400 input, inverter 402 output, inductor 404 and capacitor 408 are connected together. Capacitor 406 and capacitor 408 are connected to ground. Capacitor 406 is adjustable.

Figure 4B:
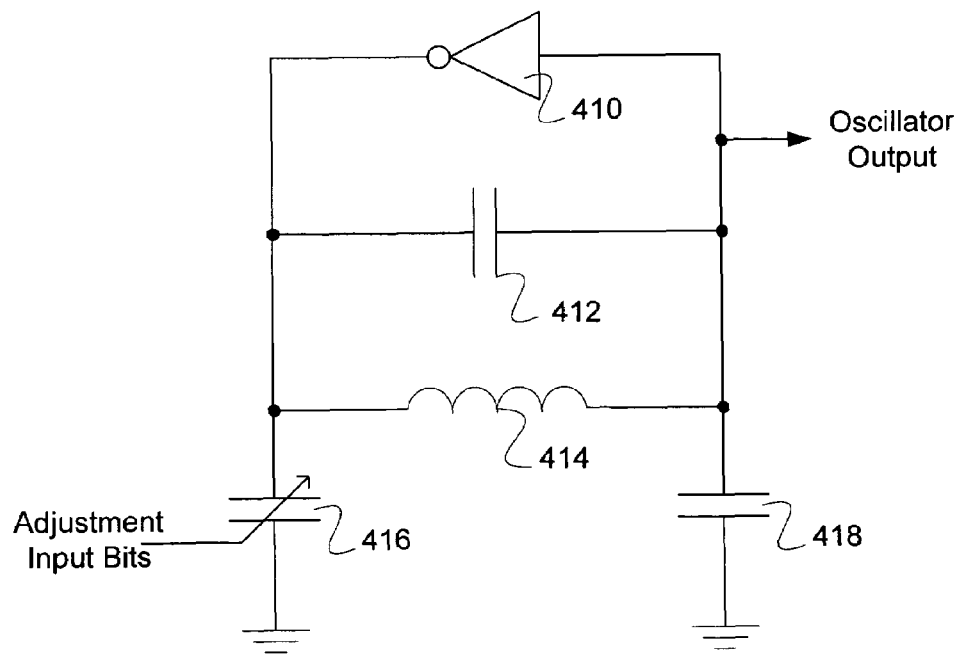
FIG. 4B is a circuit diagram illustrating an embodiment of an oscillator circuit.

FIG. 4B is a circuit diagram illustrating an embodiment of an oscillator circuit. In some embodiments, the oscillator of FIG. 4B is used to implement oscillator 302 of FIG. 3. In the example shown, the oscillator circuit includes inverter 410, inductor 414, and capacitors 412, 416 and 418. Inverter 410 output, capacitor 412, inductor 414, and capacitor 416 are connected together. Inverter 410 input, capacitor 412, inductor 414, and capacitor 418 are connected together. Capacitor 416 and capacitor 418 are connected to ground. Capacitor 416 is adjustable.

Figure 5A:
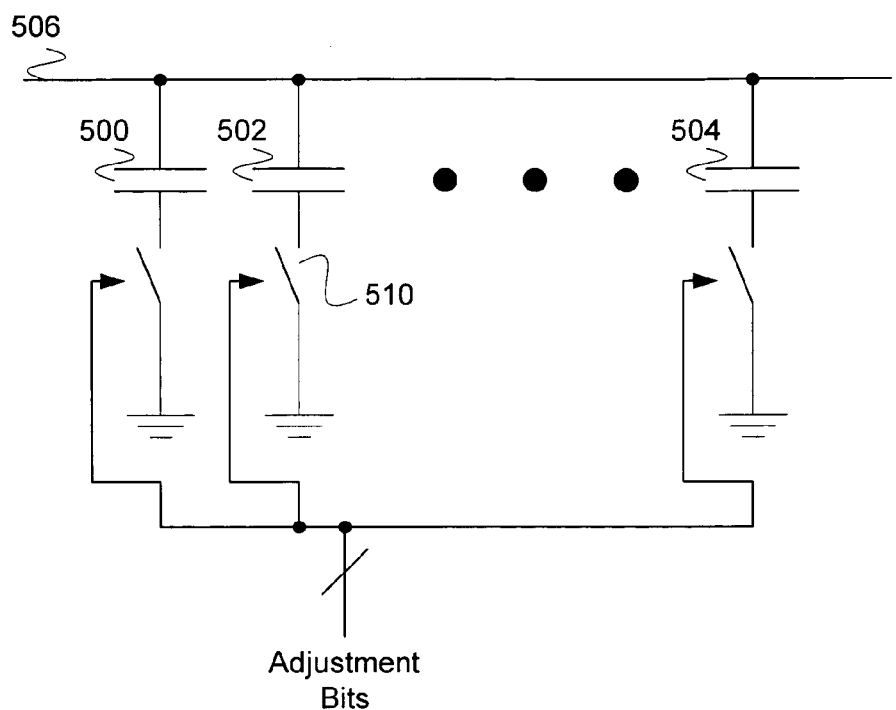
FIG. 5A is a circuit diagram illustrating an embodiment of an adjustable capacitor.

FIG. 5A is a circuit diagram illustrating an embodiment of an adjustable capacitor. In some embodiments, the adjustable capacitor of FIG. 5A is used to implement capacitor 406 of FIG. 4A and/or 416 of FIG. 4B. In the example shown, adjustable capacitor includes a plurality of capacitors, represented in FIG. 5A by capacitor 500, 502, and 504. The plurality of capacitors are connected to terminal 506. Each of the plurality of capacitors is connected to one end of a switch—for example, switch 510—that connects the end of a capacitor to ground. The switch is set using the adjustment bits. When a switch is closed, the capacitance is added to the overall capacitance of the adjustable capacitor. When a switch is open, the capacitance is not added to the overall capacitance of the adjustable capacitor.

Figure 5B:
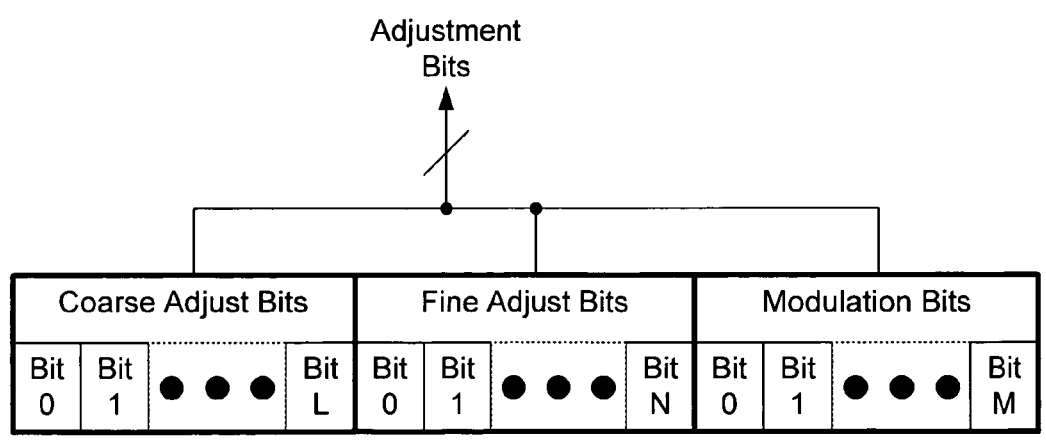
FIG. 5B is a block diagram illustrating an embodiment of adjustment bits.

FIG. 5B is a block diagram illustrating an embodiment of adjustment bits. In some embodiments, adjustment bits of FIG. 5B are used to set switches in adjustable capacitor of FIG. 5A. In the example shown, the adjustment bits are categorized into coarse adjust bits, fine adjust bits, and modulation bits. The plurality of coarse adjust bits are represented in FIG. 5B by bit 0, bit 1, and bit L. In some embodiments, the coarse adjust bits set switches attached to capacitors that are binary weighted to give a large range of adjustment for the adjustable capacitor. The plurality of fine adjust bits are represented in FIG. 5B by bit 0, bit 1, and bit N. In some embodiments, the fine adjust bits set switches attached to capacitors that are overlapping in values (e.g. sub-binary weighted) to give overlapping ranges of adjustment for the adjustable capacitor to ensure that, despite process variation and layout parasitics, all desired frequencies are achievable using the switch settings. One design criteria to ensure all frequencies are reachable is to ensure that for each bit in a non-monotonic portion of the array, the change in capacitance caused by turning on the bit is less than the sum of the change in capacitance caused by turning on all lesser significant bits. In some embodiments, the adjustment bit array includes a non-monotonically weighted portion, wherein each more significant bit of the non-monotonically weighted portion of the adjustment bit array adjusts switches that provide a change in capacitance less than the sum of the change of capacitances of all lesser significant bits. The plurality of modulation bits are represented in FIG. 5B by bit 0, bit 1, and bit M. In some embodiments, the modulation bits set switches attached to capacitors that provide for the adjustment of a modulation step, where the modulation step is used to modulate the oscillator output to encode information on the oscillator output wave form. In some embodiments, the modulation bits are used to directly modulate the radio frequency oscillator by switching the capacitance value in response to a stream of data. In some embodiments, if all the bits in the bit adjustment array are set to "1," then the oscillator frequency is a maximum (e.g., corresponding to a low capacitance value for the adjustable capacitor), and if all the bits in the bit adjustment array are set to "0," then the oscillator frequency is a minimum value (e.g., corresponding to a high capacitance value for the adjustable capacitor). In some embodiments, if all the bits in the bit adjustment array are set to "0," then the oscillator frequency is a maximum (e.g., corresponding to a low capacitance value for the adjustable capacitor), and if all the bits in the bit adjustment array are set to "1," then the oscillator frequency is a minimum value (e.g., corresponding to a high capacitance value for the adjustable capacitor).

In some embodiments, the values set in the adjustment bit array are stored (e.g., in a table or memory) in order to understand the history and direction of the oscillator frequency required to tune the oscillator to the reference frequency. In some embodiments, a previously saved value of all or part of the adjustment bit array is reloaded before the tuning is begun. In some embodiments, a coarse part of the adjustment bit array is reloaded so that the oscillator is close in frequency before tuning and the tuning is used to adjust a fine part of the adjustment bit array.

Figure 5C:
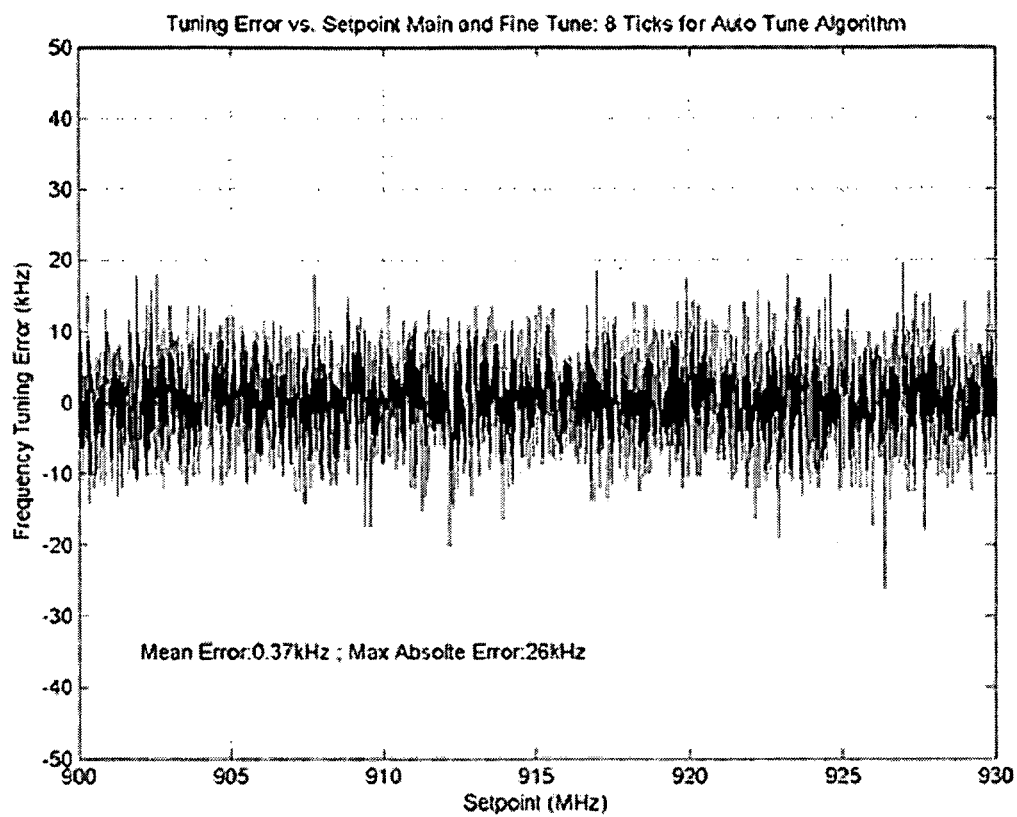
FIG. 5C is a graph illustrating measured experimental results in one embodiment.

FIG. 5C is a graph illustrating measured experimental results in one embodiment. In the example shown, the graph shows measured frequency tuning error of the oscillator versus desired frequency as the desired frequency is swept over a 900 MHz industrial, scientific, and medical (ISM) radio band. For this example, the capacitor array has a monotonic upper portion and a non-monotonic lower portion. The graph indicates that the successive approximation tuning process (e.g., as described in FIG. 7) using an adjustable capacitor is very accurate; after tuning oscillator to a frequency between 900 and 930 MHz, the mean frequency error is 0.37 KHz and the peak error is 26 KHz.

Figure 5D:
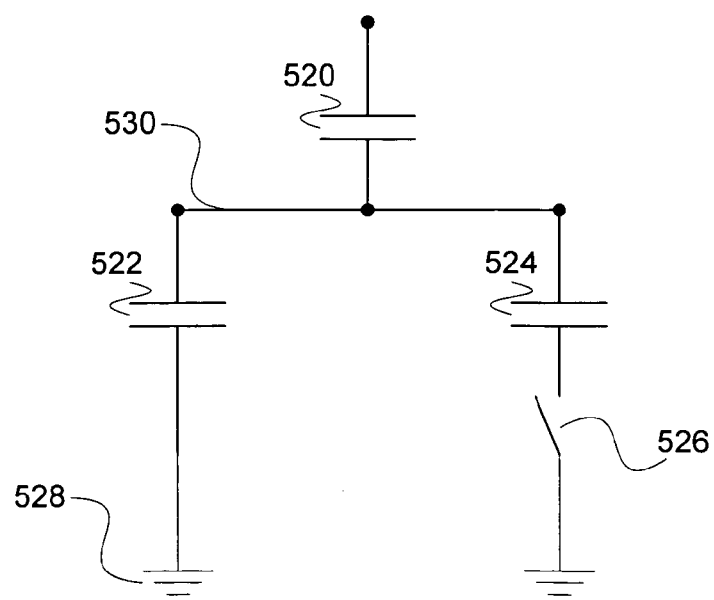
FIG. 5D is a circuit diagram illustrating an embodiment of a small capacitance circuit.

FIG. 5D is a circuit diagram illustrating an embodiment of a small capacitance circuit. In some embodiments, the circuit of FIG. 5D is used as the fine adjust capacitors or smaller value capacitors of an adjustable capacitor—for example, as capacitor 500, 502, and/or 504 in FIG. 5A. In the example shown, a first capacitor 520 has a terminal that is made available to connect to the common terminal of the capacitor array (e.g., terminal 506 of FIG. 5A). The second terminal of first capacitor 520 is connected to node 530. Node 530 is connected to a terminal of shunt capacitor 522 and switchable capacitor 524. The other terminal of shunt capacitor 522 is connected to ground (528 as shown in FIG. 5D) or to a low impedance voltage (not shown in FIG. 5D). The second terminal of switchable capacitor 524 is connected to a switch that either switches this terminal to ground or lets the terminal float. A small change in capacitance may be attained by making switchable capacitor 524 small in comparison with shunt capacitor 522. Arbitrarily small changes in capacitance may be attained using this topology with reasonably sized capacitors, for example each capacitor having a capacitance value greater than 20fF.

Figure 6:
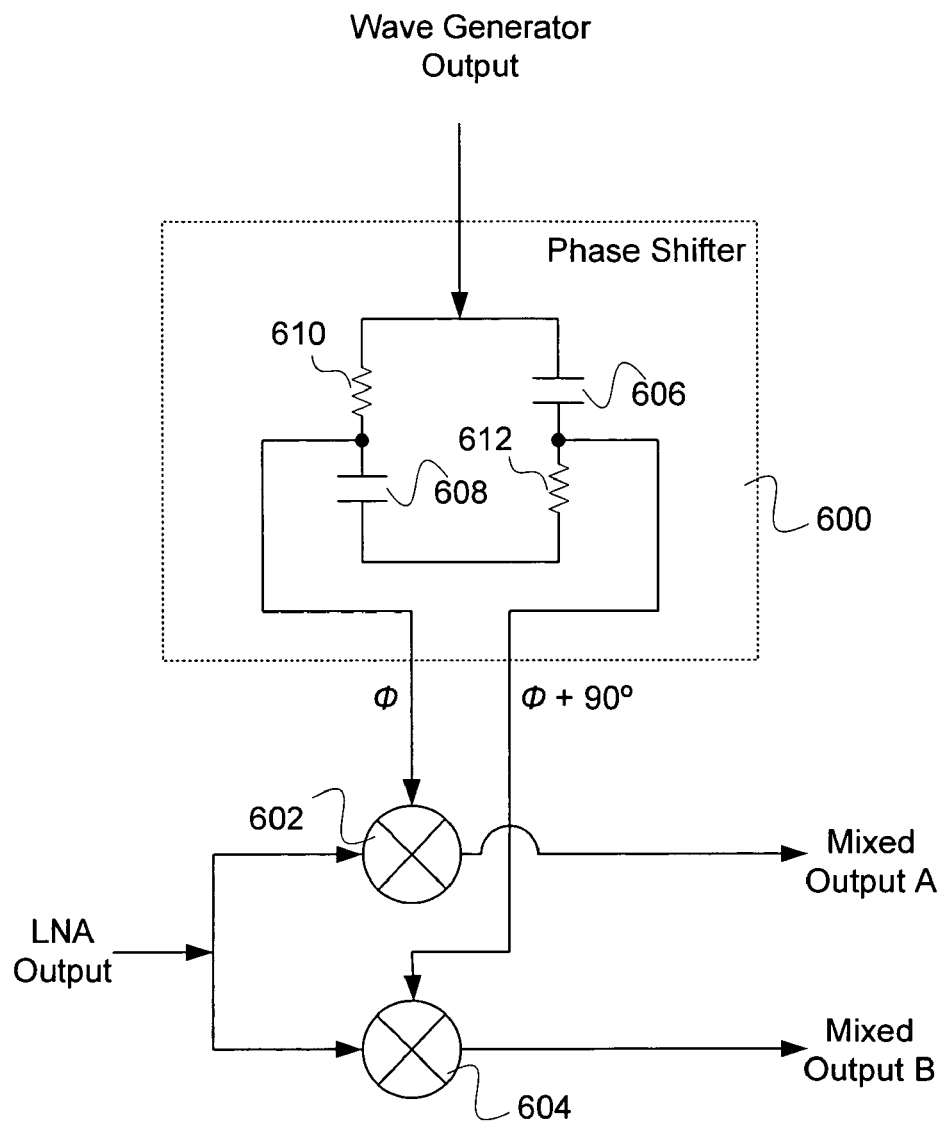
FIG. 6 is a circuit diagram illustrating an embodiment of a phase shifter network and mixer.

FIG. 6 is a circuit diagram illustrating an embodiment of a phase shifter network and mixer. In some embodiments, the circuit of FIG. 6 is used to implement 104 of FIG. 1. In the example shown, wave generator output is input to phase shifter 600. Phase shifter 600 includes capacitors 606 and 608 and resistors 610 and 612, which are selected such that the two outputs of phase shifter 600 are two waves of the frequency of the input wave with a 90° phase shift between them. This phase shifter design is relatively insensitive to changes in frequency. The two outputs of phase shifter 600 are each input to a mixer, mixer 602 and 604 respectively. The input signal, which was output from LNA (e.g., LNA 102 of FIG. 1), is input to both mixers 602 and 604 as well to produce mixed output A and mixed output B. In some embodiments, the mixed output A and mixed output B signals are used to demodulate the information transmitted on a carrier frequency. In some embodiments, the mixed output A and mixed output B signals are connected to a baseband processor (e.g., baseband processor 112 of FIG. 1).

Figure 7:
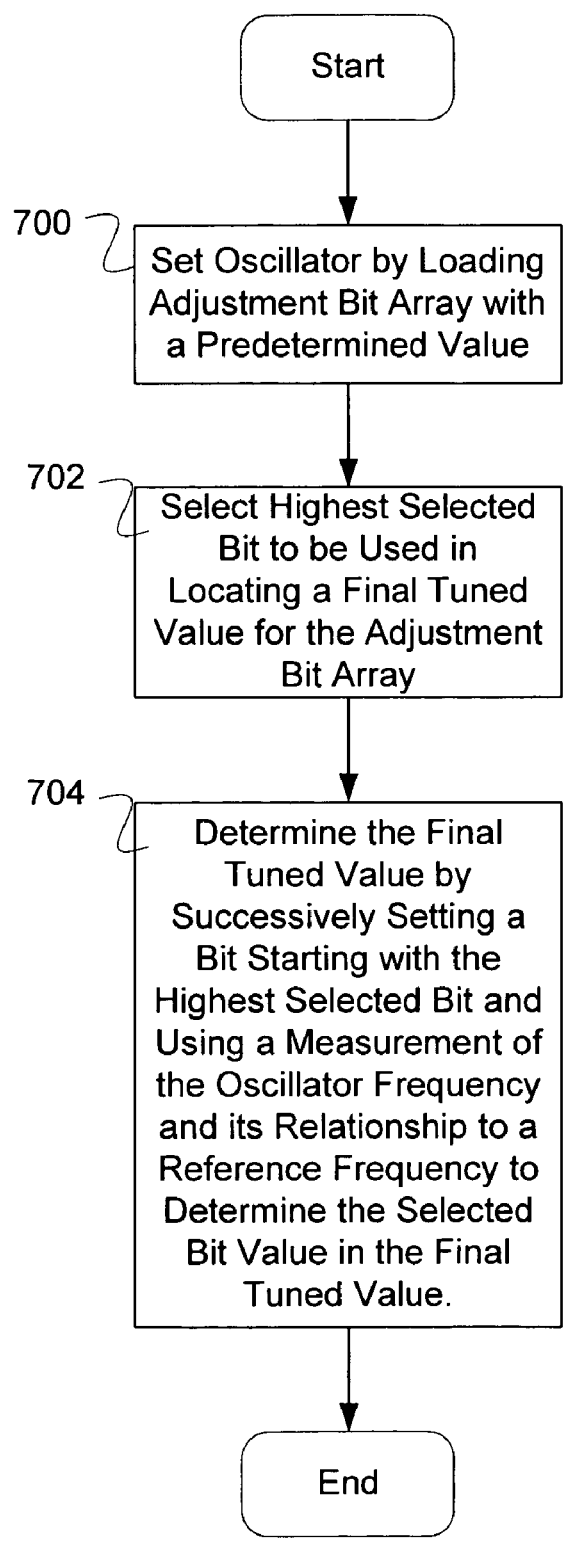
FIG. 7 is a flow diagram illustrating an embodiment of a process for tuning an oscillator frequency to a reference frequency.

FIG. 7 is a flow diagram illustrating an embodiment of a process for tuning an oscillator frequency to a reference frequency. In some embodiments, the process of FIG. 7 is executed in frequency locking engine 308 of FIG. 3. In the example shown, in 700 an oscillator is set by loading an adjustment bit array with a predetermined value. The adjustment bit array adjusts a capacitance value in the oscillator and enables the oscillator to produce different frequency output waves. In 702, a highest bit is selected to be used in locating a final tuned value for the adjustment bit array. In some embodiments, the highest bit of adjustment bit array is selected in which case all bits are used to locate the final tuned value. In some embodiments, some higher level bits are predetermined and only a subset of bits are used to locate the final tuned value; in some cases this reduces the search time for locating the final tuned value. In 704, the final tuned value is determined by successively setting a bit and using a measurement of the oscillator frequency, or in some cases a divided version of the oscillator frequency, and the measurement's relationship to a reference frequency to determine the selected bit value in the final bit value. Each bit is successively set to a value. The oscillator frequency changes with the setting of the adjustment bit. The oscillator frequency is compared (or a divided oscillator frequency is compared) to a reference frequency. The oscillator frequency is made to approach the reference frequency. In various embodiments, the approach is made from a high frequency or a low frequency.

Figure 8:
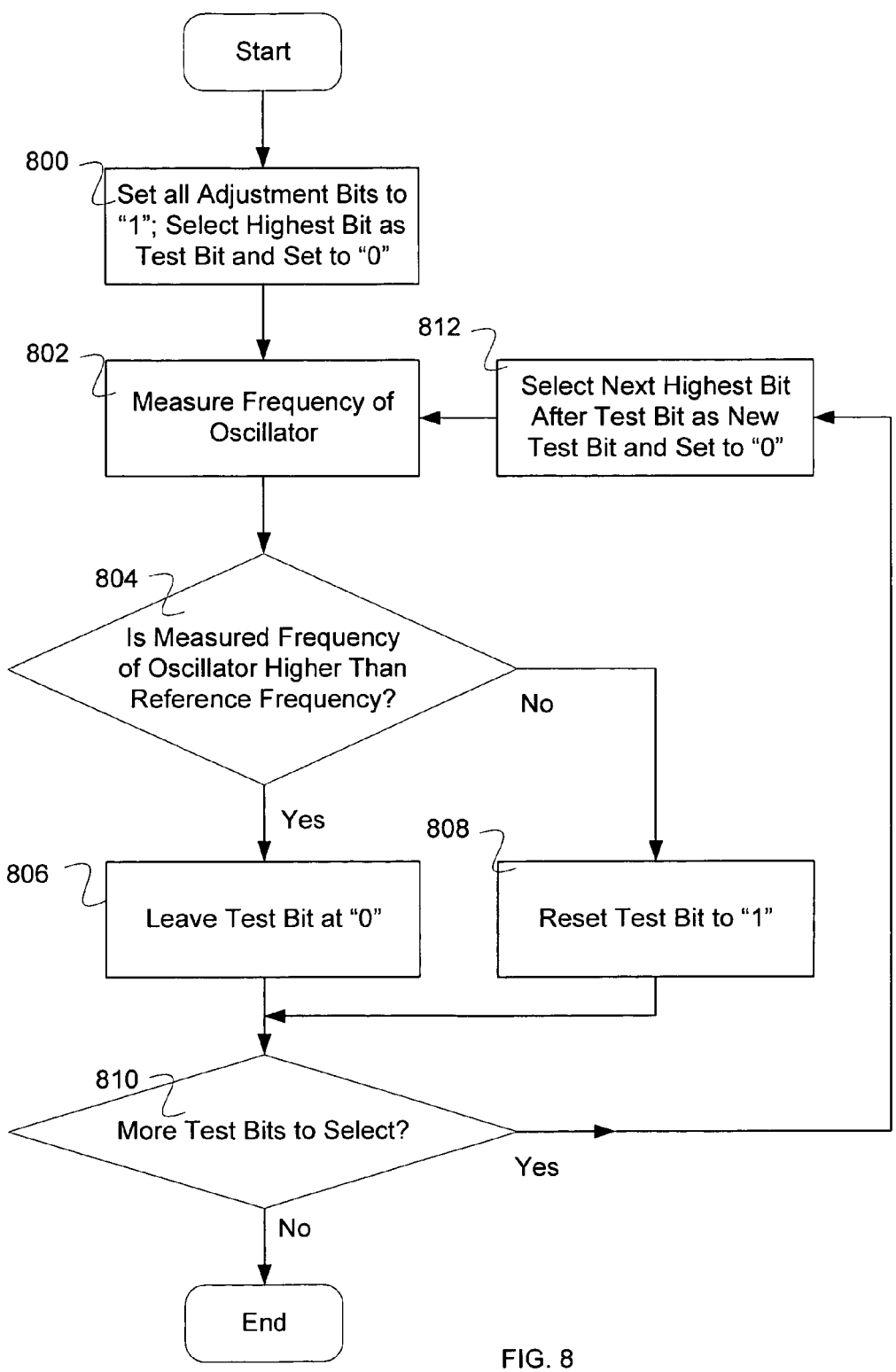
FIG. 8 is a flow diagram illustrating an embodiment of a process for tuning an oscillator frequency to a reference frequency.

FIG. 8 is a flow diagram illustrating an embodiment of a process for tuning an oscillator frequency to a reference frequency. In some embodiments, the process of FIG. 8 is executed in frequency locking engine 308 of FIG. 3. In the example shown, in 800 all adjustment bits are set to "1" and the highest bit is selected as a test bit and the test bit is set to 0. In some embodiments, setting all the adjustment bits to "1" sets the frequency to a maximum frequency value. In 802, after the test bit is set to "0", the frequency of the oscillator is measured. In some embodiments, a divided down frequency of the oscillator is measured. In some embodiments, the measurement is a counting of periods output from the oscillator using a counter during a number of clocks of a reference clock. In 804, it is determined if the measured frequency is higher than the reference frequency. If it is higher, then in 806 the test bit is left at "0." If it is not higher, then in 808 it is reset to "1." In 810, it is determined if there are more bits to select. If there are, then in 812 the next highest bit after the test bit is selected as the new test bit and set it to "0," and control is passed to 802. If in 810 it is determined that there are no more bits to select, then the process ends. In some embodiments, the counter used in measuring the oscillator error, the divider (if the frequency of the oscillator is divided down), the frequency locking engine, or any other circuitry involved in tuning the oscillator frequency are disabled after tuning in order to save on consuming power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for tuning a radio oscillator frequency to a reference frequency comprising:
   setting a radio oscillator using a predetermined value loaded into an adjustment bit array;
   selecting a highest selected bit to be used in locating a final tuned value for the adjustment bit array;
   determining the final tuned value by successively setting a selected bit starting with the highest selected bit in the adjustment bit array; and
   determining the selected bit value in the final tuned value using a measurement of the radio oscillator frequency and its relation to a reference frequency.

2. A method as in claim 1, wherein the final tuned value is stored in a digital memory.

3. A method as in claim 1, wherein the predetermined value loaded into the adjustment bit array comprises a previously stored final tuned value.

4. A method as in claim 1, wherein the reference frequency is derived from one or more of the following: a crystal oscillator, a watch crystal oscillator, a quartz crystal oscillator, an oscillator, and a 32.768 KHz oscillator.

5. A method as in claim 1, further comprising disabling tuning circuitry after determining the final tuned value.

6. A method as in claim 1, further comprising disabling tuning circuitry after determining the final tuned value, wherein the tuning circuitry includes one or more of the following: an oscillator frequency measurement counter, a frequency locking engine, and an oscillator divider.

7. A method as in claim 1, wherein setting the radio oscillator includes adjusting a capacitor value.

8. A method as in claim 1, wherein setting the radio oscillator includes adjusting a capacitor value using the adjustment bit array.

9. A method as in claim 8, wherein adjusting the capacitor value includes setting a switch in a circuit comprising:
   a first capacitor including a first capacitor first terminal and a first capacitor second terminal;
   a second capacitor including a second capacitor first terminal and a second capacitor second terminal;
   a third capacitor including a third capacitor first terminal and a third capacitor second terminal;
   wherein the first capacitor second terminal is connected to the second capacitor first terminal;
   wherein the first capacitor second terminal is connected to the third capacitor first terminal; and
   wherein the third capacitor second terminal is connected to a switch first terminal.

10. A method as in claim 8, wherein the second capacitor second terminal is connected to one of the following: ground or a low impedance voltage.

11. A method as in claim 1, wherein the adjustment bit array includes a coarse adjustment set of bits.

12. A method as in claim 1, wherein the adjustment bit array includes a fine adjustment set of bits.

13. A method as in claim 1, wherein the adjustment bit array includes a coarse adjustment set of bits and wherein the coarse bits adjust a capacitor in binary weighted values.

14. A method as in claim 1, wherein the adjustment bit array includes a fine adjustment set of bits and wherein the fine bits adjust a capacitor in non-monotonically weighted values.

15. A method as in claim 1, wherein the adjustment bit array includes a modulation array used to directly modulate the radio frequency oscillator in response to a stream of data.

16. A method as in claim 1, wherein the adjustment bit array includes a non-monotonically weighted portion, wherein each more significant bit of the non-monotonically weighted portion of the adjustment bit array adjusts switches that provide a change in capacitance less than the sum of the change of capacitances of all lesser significant bits.

17. A method as in claim 1, wherein the measurement of the oscillator frequency includes counting oscillations from the oscillator for a number of periods of a reference clock.

18. A method as in claim 1, wherein the measurement of the oscillator frequency includes dividing down the oscillations from the oscillator.

19. A method as in claim 1, wherein the predetermined value in the adjustment bit array sets the oscillator to a maximum frequency.

20. A method as in claim 19, wherein the bits are successively set such that the oscillator oscillates at lower frequencies.

21. A method as in claim 1, wherein the predetermined value in the adjustment bit array sets the oscillator to a minimum frequency.

22. A method as in claim 21, wherein the bits are successively set such that the oscillator oscillates at higher frequencies.

23. A method as in claim 1, wherein the bits are successively set from highest bit to lowest bit.

24. A method as in claim 1, wherein the final tuned value in the adjustment bit array is stored.

25. A computer program product for tuning a radio oscillator frequency to a reference frequency, the computer program product being embodied in a computer readable medium and comprising computer instructions for:

setting a radio oscillator using a predetermined value loaded into an adjustment bit array;

selecting a highest selected bit to be used in locating a final tuned value for the adjustment bit array;

determining the final tuned value by successively setting a selected bit starting with the highest selected bit in the adjustment bit array; and determining the selected bit value in the final tuned value using a measurement of the radio oscillator frequency and its relation to a reference frequency.

26. A system for tuning a radio oscillator frequency to a reference frequency comprising:

a processor; and a memory coupled with the processor, wherein the memory is configured to provide the processor with instructions which when executed cause the processor to:

set a radio oscillator using a predetermined value loaded into an adjustment bit array;

select a highest selected bit to be used in locating a final tuned value for the adjustment bit array;

determine the final tuned value by successively setting a selected bit starting with the highest selected bit in the adjustment bit array; and determine the selected bit value in the final tuned value using a measurement of the radio oscillator frequency and its relation to a reference frequency.

* * * * *